(12) United States Patent
Lai et al.

(10) Patent No.: US 7,942,196 B2
(45) Date of Patent: May 17, 2011

(54) HEAT SPREADER WITH VAPOR CHAMBER

(75) Inventors: Cheng-Tien Lai, Taipei Hsien (TW);
Zhi-Yong Zhou, Shenzhen (CN);
Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 678 days.

(21) Appl. No.: 11/964,912

(22) Filed: Dec. 27, 2007

(65) Prior Publication Data

US 2009/0166003 A1    Jul. 2, 2009

(51) Int. Cl.
*F28D 15/00* (2006.01)
*H05K 7/20* (2006.01)

(52) U.S. Cl. ............................ 165/104.26; 165/104.21
(58) Field of Classification Search ............ 165/104.21, 165/104.26; 361/700; 257/715; 174/15.2
See application file for complete search history.

(56) References Cited

U.S. PATENT DOCUMENTS

| | | | | |
|---|---|---|---|---|
| 3,613,778 A * | 10/1971 | Feldman, Jr. | ............ | 165/104.26 |
| 4,840,224 A * | 6/1989 | Dietzsch | ................ | 165/104.26 |
| 6,158,502 A * | 12/2000 | Thomas | .................. | 165/104.26 |
| 6,812,563 B2 * | 11/2004 | Go et al. | ...................... | 257/715 |
| 6,889,756 B1 * | 5/2005 | Hou | ........................ | 165/104.33 |
| 6,957,692 B1 * | 10/2005 | Win-Haw et al. | ........ | 165/104.33 |
| 7,447,029 B2 * | 11/2008 | Lai et al. | ...................... | 361/700 |
| 2003/0173064 A1 * | 9/2003 | Ueki et al. | ................ | 165/104.21 |
| 2006/0144565 A1 * | 7/2006 | Tsai et al. | ................ | 165/104.26 |
| 2009/0032227 A1 * | 2/2009 | Krassowski et al. | ..... | 165/104.26 |

* cited by examiner

*Primary Examiner* — Tho V Duong
(74) *Attorney, Agent, or Firm* — Jeffrey T. Knapp

(57) ABSTRACT

A heat spreader for cooling an electronic component includes a lower plate defining a chamber, an upper plate fixed on the lower plate to seal the chamber, a first wick layer and a second wick layer sandwiched between the lower plate and the upper plate, and a working liquid contained in the chamber. The first wick layer and the second wick layer respectively define a plurality of apertures, which include right-angled triangle, acute-angled triangle, and rhomboid apertures communicating with each other for containing the working liquid therein.

15 Claims, 4 Drawing Sheets

US 7,942,196 B2

HEAT SPREADER WITH VAPOR CHAMBER

BACKGROUND OF THE INVENTION

1. Field of the Invention

The present invention relates to a heat spreader, and more particularly to a heat spreader with an improved vapor chamber for reducing a thickness thereof.

2. Description of Related Art

It is well known that heat is generated during operations of electronic components, such as integrated circuit chips. To ensure normal and safe operations, cooling devices such as heat sinks are often employed to dissipate the generated heat away from these electronic components.

As progress continues to be made in the electronics art, more components on the same real estate generate more heat. The heat sinks used to cool these chips are accordingly made larger in order to possess a higher heat removal capacity, which causes the heat sinks to have a much larger footprint than the chips. Generally speaking, a heat sink is more effective when there is a uniform heat flux applied over an entire base of the heat sink. When a heat sink with a large base is attached to an integrated circuit chip with a much smaller contact area, there is significant resistance to the flow of heat to the other portions of the heat sink base which are not in direct contact with the chip.

A mechanism for overcoming the resistance to heat flow in a heat sink base is to attach a heat spreader to the heat sink base or directly make the heat sink base as a heat spreader. Conventionally, the heat spreader has a vacuum chamber defined therein, a wick layer provided in the chamber and formed allover inner faces of the chamber, and a working fluid contained in chamber and overflowing a part of the wick layer. As an integrated circuit chip is maintained in thermal contact with the heat spreader, the working fluid contained in the wick layer corresponding to a hot contacting location vaporizes. The vapor then spreads to fill the chamber, and wherever the vapor comes into contact with a cooler surface of the chamber, it releases its latent heat of vaporization and condenses. The condensate reflows to the hot contacting location via a capillary force generated by the wick layer. Thereafter, the condensate frequently vaporizes and condenses to form a circulation to thereby remove the heat generated by the chip.

Since the wick layer is distributed allover the inner faces of the heat spreader having a poor capability of storing liquid, a predetermined space should be formed inside the heat spreader to contain enough liquid therein. Thus, two parts of the wick layer formed on two opposite inner faces of the heat spreader have a distance defined therebetween to form the predetermined space. However, the distance would cause the heat spreader to be thick, and can not be mounted in a thin electronic device which has became a development tendency nowadays.

What is needed, therefore, is a heat dissipating device which can overcome the above-mentioned disadvantages.

SUMMARY OF THE INVENTION

A heat spreader for cooling an electronic component includes a lower plate defining a chamber, an upper plate fixed on the lower plate to seal the chamber, a first wick layer and a second wick layer sandwiched between the upper plate, and working liquid contained in the chamber. The first wick layer and the second wick layer respectively define a plurality of apertures, which include right-angled triangle, acute-angled triangle, and rhomboid apertures communicating with each other for containing the working liquid therein. Since the working liquid can be contained in the apertures, there is no need to separate the first wick layer and the second wick layer to form a space therebetween.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
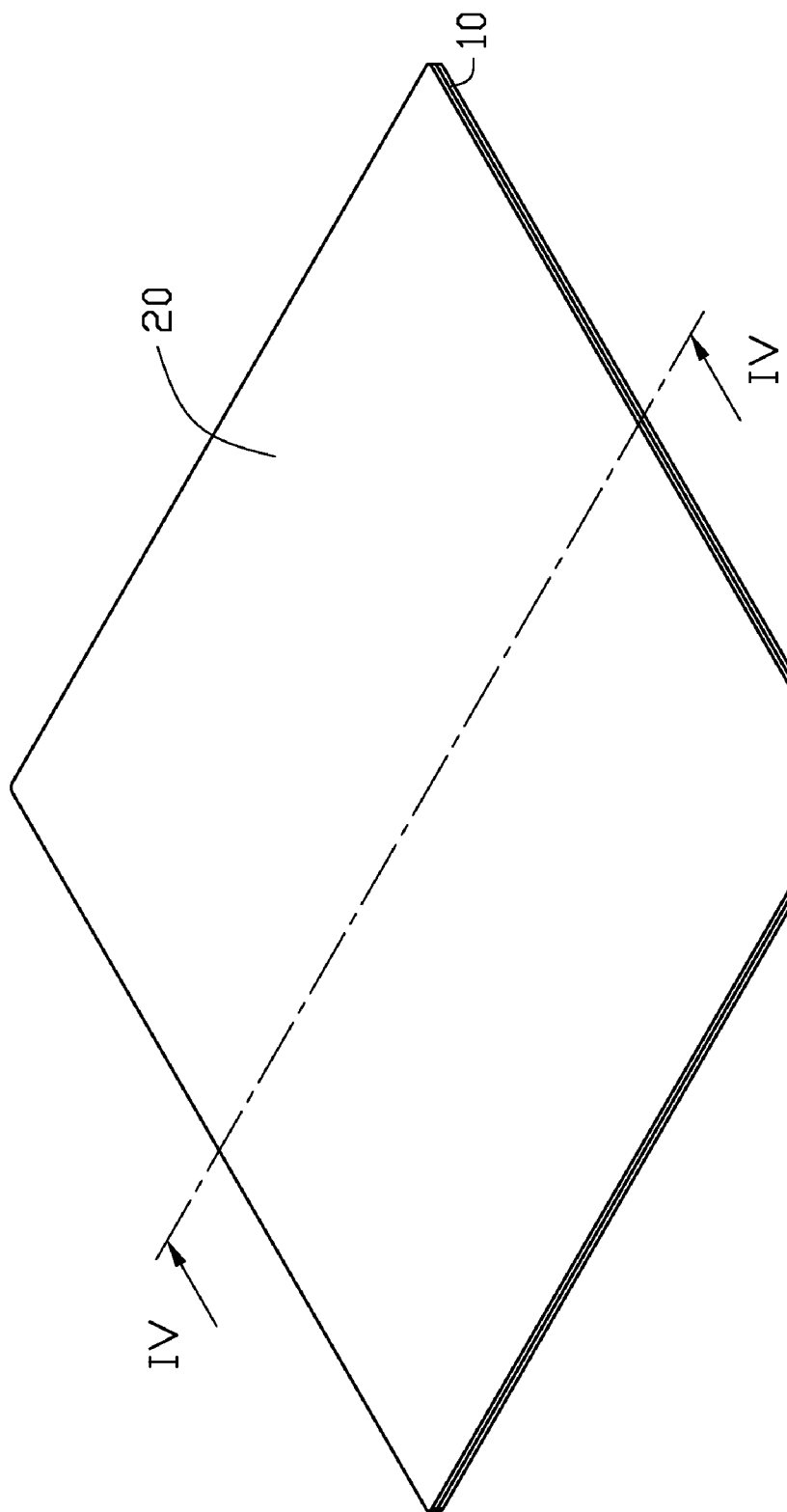
FIG. 1 is an assembled, isometric view of a heat spreader in accordance with a preferred embodiment of the present invention.
Figure 2:
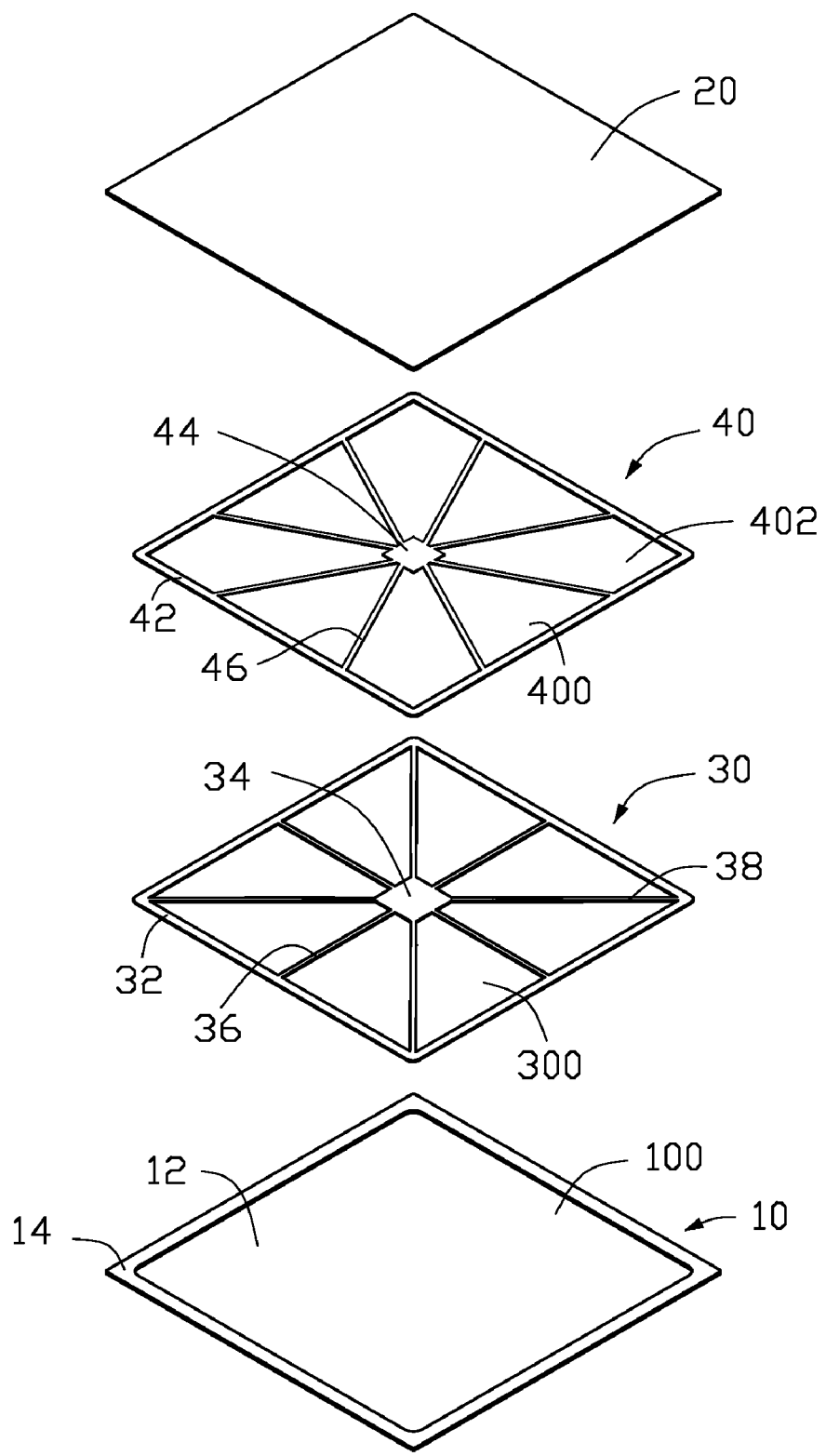
FIG. 2 is an exploded view of FIG. 1.

Referring to FIGS. 1-2, a heat spreader in accordance with a preferred embodiment of the present invention is used for an electronic component to dissipating heat therefrom. The heat spreader comprises a lower plate 10, an upper plate 20 hermetically fixed on the lower plate 10, a first wick layer 30 and a second wick layer 40 sandwiched between the upper plate 20 and the lower plate 10, and a kind of working liquid (not shown) filled therein.

The lower plate 10 comprises a square tank 12 and a flange 14 extending outwardly and horizontally from a top of the tank 12. A central area of a bottom face of the tank 12 is for contacting the electronic component to absorb heat therefrom. The tank 12 defines a square chamber 100 therein for receiving the first wick layer 30 and the second wick layer 40 and the working liquid.

The upper plate 20 has a square configuration, it is airtightly and liquid-tightly secured on the flange 14 of the lower plate 10 to cover the chamber 100, thereby sealing the working liquid in the chamber 100.

Figure 4:
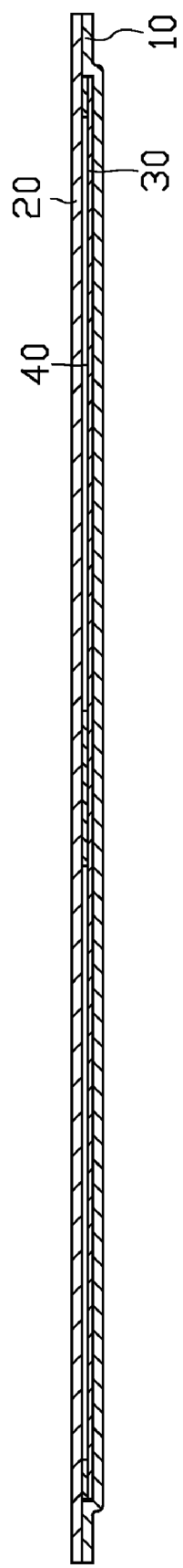
FIG. 4 is a cross-sectional view of FIG. 1 taking along a line IV-IV.

Also shown in FIG. 4, the first wick layer 30 and the second wick layer 40 are made by weaving metal wires in the present invention, they have a large amount of pores (not shown) therein, to generate capillary force for transferring the working liquid. Alternatively, the first wick layer 30 and the second wick layer 40 can also be made by other methods that are well known by those skilled ones in the related art, i.e., sintering metal power. The first wick layer 30 is disposed into the chamber 100 to partially cover a bottom of the chamber 100. The first wick layer 30 comprises a square ring 32, a square tab 34, and a plurality of strips 36, 38 connecting the ring 32 to the tab 34. An exterior periphery of the ring 32 is similar to an interior periphery of the tank 12, and a thickness of the ring 32 is identical to a half of a depth of the chamber 100 (viewed from FIG. 4), whereby the first wick layer 30 can be accommodated in the chamber 100 substantially. The tab 34 is formed at a center of the ring 32, it contacts a central part of a bottom of the tank 12 corresponding to the electronic component, to thereby provide sufficient wick structure thermally connecting the electronic component. Four strips 36 each interconnect a middle of each edge of the tab 34 and a middle of each edge of the ring 32; other four strips 38 each connect each corner of the tab 34 with each corner of the ring 32. The eight strips 36, 38 divide a space surrounded by the tab 34 and the ring 32 into eight right-angled triangle apertures 300, which contain the working liquid therein.

Figure 3:
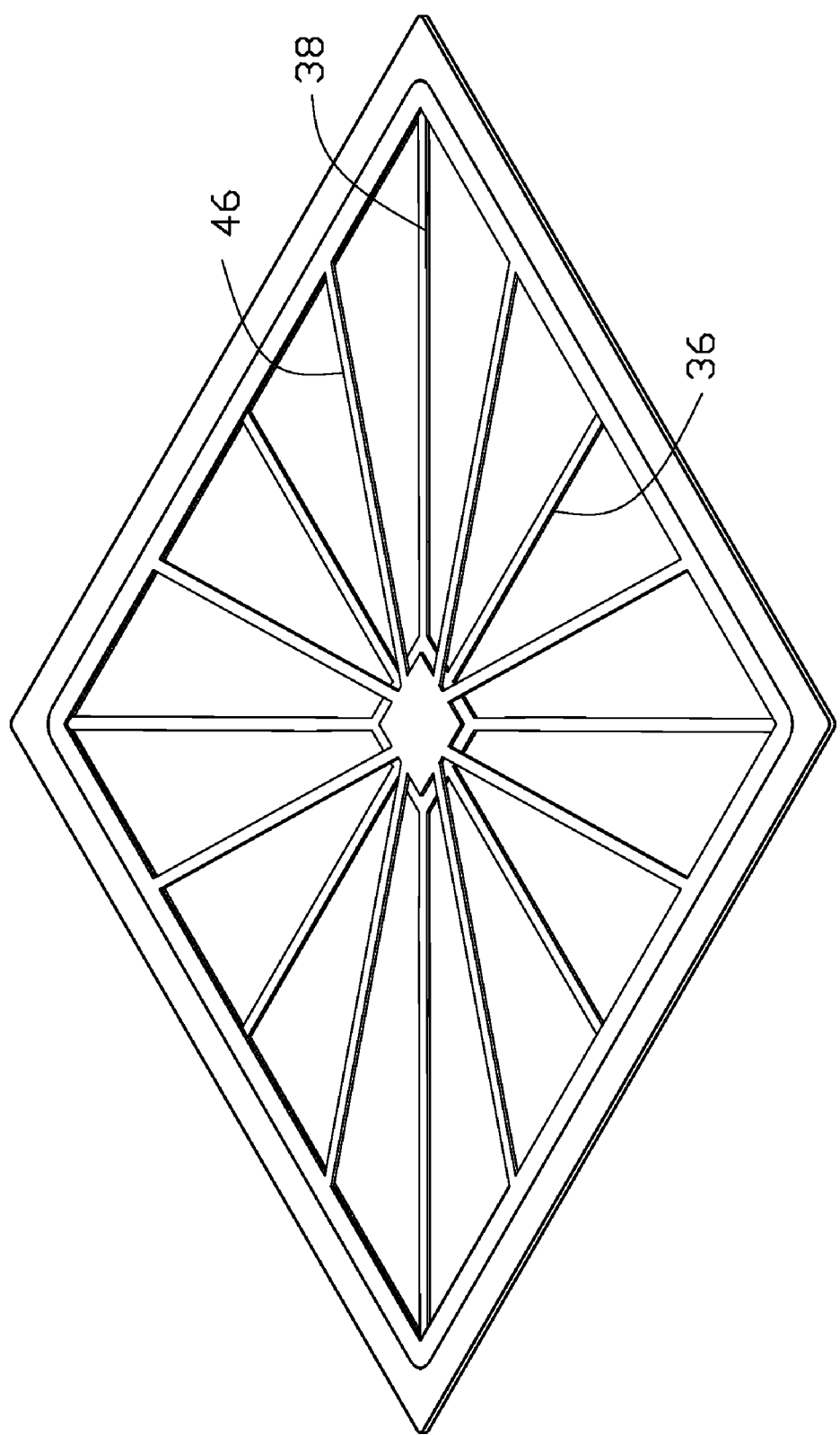
FIG. 3 is a view similar to FIG. 1 with an upper plate being removed for clarity.

As also viewed from FIG. 3, the second wick layer 40 is formed on the first wick layer 30, and comprises a square ring 42, a square tab 44, and a plurality of strips 46 extending radially from the tab 34 to the ring 32. The ring 42 of the second wick layer 40 has a shape equal to that of the ring 32 of the first wick layer 30. A thickness of the second wick layer 40 is essentially equal to half of the depth of the chamber 100, whereby when the second wick layer 40 is placed on the first wick layer 30, a top face of the second wick layer 40 is coplanar with a top face of the flange 14 and in direct contact with a bottom face of the upper plate 20 (illustrated in FIG. 4). The tab 44 of the second wick layer 40 is located at a central area of the ring 42 and has an area less than that of the tab 34 of the first wick layer 30. Each strip 46 couples a part of the tab 44 located near a middle of each edge thereof with a part of the ring 42 located next to a one-third portion of each edge thereof. The strips 46 divide a space surrounded by the ring 42 and the tab 44 into four isosceles, acute-angled triangle apertures 400 and four rhomboid apertures 402 alternating with the four triangle apertures 400, all of which also contain the working liquid therein. The second wick layer 40 is constructed on the first wick layer 30 in a manner such that the strips 36, 38 of the first wick layer 30 are staggered with the strips 46 of the second wick layer 40 (shown in FIG. 3), and the eight triangle apertures 300 of the first wick layer 30 communicate with the four triangle apertures 400 and the four rhomboid apertures 402 of the second wick layer 40. In other words, each of the strips 36, 38 of the first wick layer 30 is located between every two strips 46 of the second wick layer 40.

In use, the lower plate 10 is disposed on the electronic component with the central area of a bottom of the tank 12 contacting the electronic component. The electronic component operates and generates heat. The working liquid near the tabs 34, 44 is heated and vapored to vapor. The vapor spreads to fill the chamber 100, and is condensed to liquid as it reaches the upper plate 20. The condensed liquid refluences to the tab 34, 44 through the strips 36, 38, 46 via capillary force generated by the first wick layer 30 and the second wick layer 40. The vapored and condensed cycle repeats, thereby to bring the heat from the electronic component continuously.

Since there are communicating apertures 300, 400, 402 respectively formed in the first wick layer 30 and the second wick layer 40, the working liquid can be contained in these apertures 300, 400, 402 instead of between the first wick layer 30 and the second wick layer 40. Therefore, no space is needed being formed between the first wick layer 30 and the second wick layer 40 to contain the working liquid therein, and the first wick layer 30 can directly contact and partially overlay the second wick layer 40. Accordingly, a thickness of the heat spreader can be controlled in a small range for catching a requirement of lighter and thinner development tendency of electronic device.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat spreader adapted for dissipating heat from an electronic component, the heat spreader comprising:
   a lower plate defining a chamber therein;
   an upper plate fixed on the lower plate to seal the chamber;
   a working liquid contained in the chamber;
   a first wick layer accommodated in the chamber; and
   a second wick layer formed on the first wick layer and received in the chamber,
   wherein the first wick layer and the second wick layer each define a plurality of apertures communicating with each other to receive the working liquid therein;
   wherein the first wick layer comprises a ring, a tab located in a central area of the ring, and a plurality of strips interconnecting the tab and the ring, the plurality of apertures of the first wick layer being formed between the plurality of strips of the first wick layer;
   wherein the second wick layer comprises a ring, a tab located in a central area of the ring, and a plurality of strips interconnecting the tab and the ring, the plurality of apertures of the second wick layer being formed between the plurality of strips of the second wick layer; and
   wherein the plurality of strips of the first wick layer are staggered with the plurality of strips of the second wick layer.

2. The heat spreader as claimed in claim 1, wherein a total thickness of the first wick layer combined with the second wick layer is identical to a depth of the chamber.

3. The heat spreader as claimed in claim 1, wherein the second wick layer is substantially sandwiched between the upper plate and the first wick layer, the second wick layer directly contacting the upper plate.

4. The heat spreader as claimed in claim 1, wherein each of the plurality of apertures of the first wick layer has a right-angled triangle shape.

5. The heat spreader as claimed in claim 1, wherein the plurality of apertures of the second wick layer consists of acute-angled triangle apertures and rhomboid apertures alternating with the acute-angled triangle apertures.

6. The heat spreader as claimed in claim 1, wherein the tab of the second wick layer has an area less than that of the tab of the first wick layer, the tab of the second wick layer being in alignment with and contacting the tab of the first wick layer.

7. The heat spreader as claimed in claim 1, wherein the ring of the first wick layer has a rectangular configuration essentially equal to that of the ring of the second wick layer.

8. The heat spreader as claimed in claim 1, wherein each of the first wick layer and the second wick layer comprises eight strips.

9. A heat spreader adapted for cooling an electronic component, the heat spreader comprising:
   a lower plate defining a chamber therein;
   a planar upper plate fixed on the lower plate to cover the chamber;
   a first wick layer formed on a bottom the chamber, the first wick layer comprising a plurality of strips separating a lower part of the chamber into a plurality of first apertures;
   a second wick layer formed on the first wick layer and directly contacting a bottom of the upper plate, the second wick layer comprising a plurality of strips dividing an upper part of the chamber into a plurality of second apertures; and
   a working liquid contained in the plurality of first apertures and the plurality of second apertures, wherein the plurality of strips of the first wick layer are staggered with the plurality of strips of the second wick layer so that the plurality of first apertures communicates with the plurality of second apertures; and wherein each of the plurality of first apertures is right-angled triangle shaped.

10. The heat spreader as claimed in claim 9, wherein the plurality of second apertures has an acute-angled triangle aperture and a rhomboid aperture adjacent to the acute-angled triangle aperture.

11. The heat spreader as claimed in claim 9, wherein each of the first wick layer and the second wick layer comprises a ring and a tab surrounded by the ring, corresponding ones of the plurality of strips coupling the ring and the tab.

12. The heat spreader as claimed in claim 11, wherein an area of the tab of the first wick layer is less than that of the tab of the second wick layer.

13. The heat spreader as claimed in claim 11, wherein the rings of the first wick layer and the second wick layer are rectangular and contact lateral walls of the chamber of the heat spreader.

14. A heat spreader adapted for removing heat from an electronic component, the heat spreader comprising:

a lower plate having a tank defining a chamber therein and a flange extending outwardly from a top of the tank;

a planer upper plate secured on the flange to seal the chamber;

a pair of wick layers sandwiched between the tank and the upper plate, each of the wick layers having a large amount of pores for generating capillary force; and a coolant contained in the chamber, wherein a depth of the chamber defines an overall thickness of the pair of wick layers, and wherein one of the wick layers defines a plurality of apertures communicating with a plurality of additional apertures defined by the other wick layer; and wherein each of the plurality of apertures has a right-angled triangle shape, some of the plurality of additional apertures have acute-angled triangle shapes, and other of the plurality of additional apertures have rhomboid shapes.

15. The heat spreader as claimed in claim 14, wherein the each of the plurality of apertures and the plurality of additional apertures is larger than each of the pores.

* * * * *